(12) United States Patent
Jung et al.

(10) Patent No.: US 12,394,488 B2
(45) Date of Patent: Aug. 19, 2025

(54) MEMORY DEVICE PERMITTING OVERWRITE PROGRAM OPERATION AND OPERATION METHOD THEREOF

(71) Applicant: SK hynix Inc., Gyeonggi-do (KR)

(72) Inventors: Jae Yeop Jung, Gyeonggi-do (KR); Sung Hyun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 146 days.

(21) Appl. No.: 18/494,769

(22) Filed: Oct. 26, 2023

(65) Prior Publication Data

US 2024/0420769 A1 Dec. 19, 2024

(30) Foreign Application Priority Data

Jun. 19, 2023 (KR) .................. 10-2023-0078006

(51) Int. Cl.
*G11C 16/10* (2006.01)
*G11C 16/34* (2006.01)

(52) U.S. Cl.
CPC .......... *G11C 16/10* (2013.01); *G11C 16/3459* (2013.01)

(58) Field of Classification Search
CPC ..................................... G11C 16/10
See application file for complete search history.

(56) References Cited

U.S. PATENT DOCUMENTS 9,286,986 B2 3/2016 Yeh et al.
2017/0242632 A1* 8/2017 Cho ................ G06F 3/0655

FOREIGN PATENT DOCUMENTS

KR 10-1832934 B1 2/2018

* cited by examiner

*Primary Examiner* — Jason Lappas
(74) *Attorney, Agent, or Firm* — IP & T GROUP LLP

(57) ABSTRACT

A memory device comprising: a memory cell array including memory cells coupled between a word line and a plurality of bit lines, and a control unit suitable for performing a program operation of repeating a program loop including a voltage application operation and a verification operation on the memory cells according to an Incremental Step Pulse Program (ISPP) method until the program operation is performed successfully, wherein the control unit repeatedly performs the program loop by setting a voltage level of an initial program pulse to one of first and second levels according to whether the program operation is an overwrite operation or not, wherein the initial program pulse is to be applied to the word line in the voltage application operation included in an initial program loop of the repeated program loops, and wherein the second level is lower than the first level by a first set level.

20 Claims, 10 Drawing Sheets

MEMORY DEVICE PERMITTING OVERWRITE PROGRAM OPERATION AND OPERATION METHOD THEREOF

CROSS-REFERENCE TO RELATED APPLICATIONS

The present application claims priority of Korean Patent Application No. 10-2023-0078006, filed on Jun. 19, 2023, which is incorporated herein by reference in its entirety.

BACKGROUND

1. Field

Various embodiments of the present invention relate to a memory device, and more particularly, to a memory device permitting an overwrite operation, and a method for operating the memory device.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

A cell of a nonvolatile memory device is an element on which an electrical program/erase operation may be performed. The nonvolatile memory device may perform program and erase operations on the cell by changing the threshold voltage of the cell as electrons are moved by a strong electric field applied to a thin oxide film of the cell.

Herein, a program operation may include a normal program operation of moving the voltage level of nonvolatile memory cells having a threshold voltage level of an erase state to one threshold voltage level among a plurality of threshold voltage levels, and an overwrite operation of performing a program operation once again on a non-volatile memory cell whose reliability is expected to be deteriorated because the normal program operation is not normally completed or on a non-volatile memory cell whose reliability is expected to be deteriorated even though the normal program operation is completed because retention characteristics are decreased due to a Sudden Power Off (SPO).

SUMMARY

Embodiments of the present invention are directed to a memory device capable of minimizing distribution deterioration of program target memory cells during an overwrite operation, and a method of operating the memory device.

The technical problems desired to be achieved in the embodiments of the present invention are not limited to the technical problems mentioned above, and other technical problems not mentioned above may also be clearly understood by those of ordinary skill in the art to which the present invention pertains from the description below.

In accordance with an embodiment of the present invention, a memory device may include: a memory cell array including memory cells coupled between a word line and a plurality of bit lines; and a control unit suitable for performing a program operation of repeating a program loop including a voltage application operation and a verification operation on the memory cells according to an Incremental Step Pulse Program (ISPP) method until the program operation is performed successfully. The control unit may repeatedly perform the program loop by setting a voltage level of an initial program pulse to one of first and second levels according to whether the program operation is an overwrite operation or not. The initial program pulse may be to be applied to the word line in the voltage application operation included in an initial program loop of the repeated program loops. The second level may be lower than the first level by a first set level.

In accordance with another embodiment of the present invention, a method for operating a memory device including memory cells coupled between a word line and a plurality of bit lines, may include: performing a program operation of repeating a program loop including a voltage application operation and a verification operation on the memory cells according to an ISPP (Incremental Step Pulse Program) method until the program operation is performed successfully; and checking whether the program operation is an overwrite operation or not. The repeatedly performing may include setting a voltage level of an initial program pulse to one of first and second levels according to whether the program operation is the overwrite operation or not. The initial program pulse may be to be applied to the word line in the voltage application operation included in an initial program loop of the repeated program loops. The second level may be lower than the first level by a first set level.

In accordance with another embodiment of the present invention, an operating method of a memory device, may include: lowering at least one of a voltage level and an increment of a program pulse in proportion to a number of times that a program operation has been successful on a memory cell group according to an Incremental Step Pulse Program (ISPP) scheme; and performing, based on the lowered voltage level and increment, the program operation according to the ISPP scheme. The program pulse may be provided to the memory cell group at least during each of initial and subsequent program loops within the program operation.

DETAILED DESCRIPTION

Figure 1:
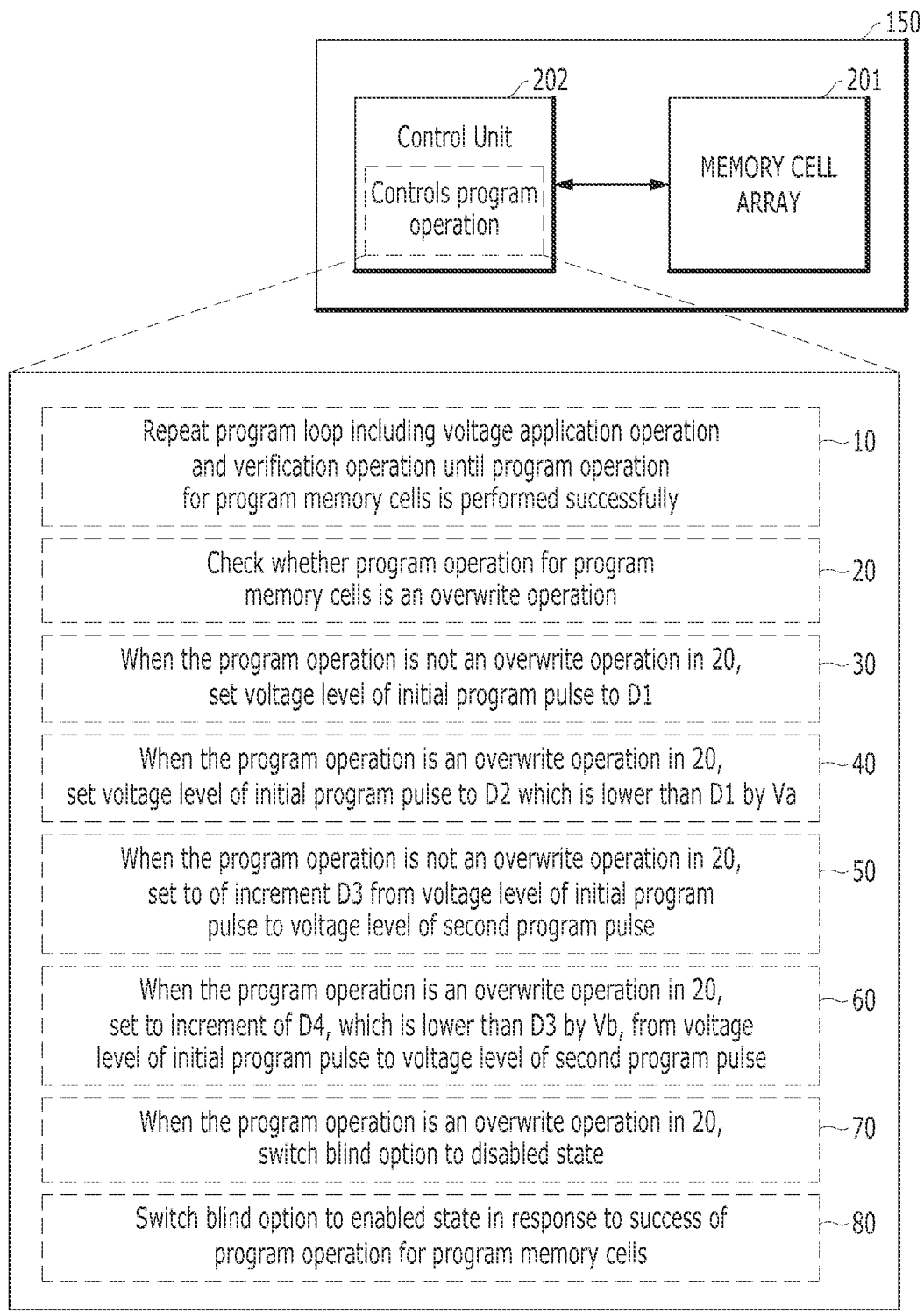
FIG. 1 is a block diagram illustrating a memory device in accordance with an embodiment of the present invention.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a block diagram illustrating a memory device in accordance with an embodiment of the present invention.

Figure 2:
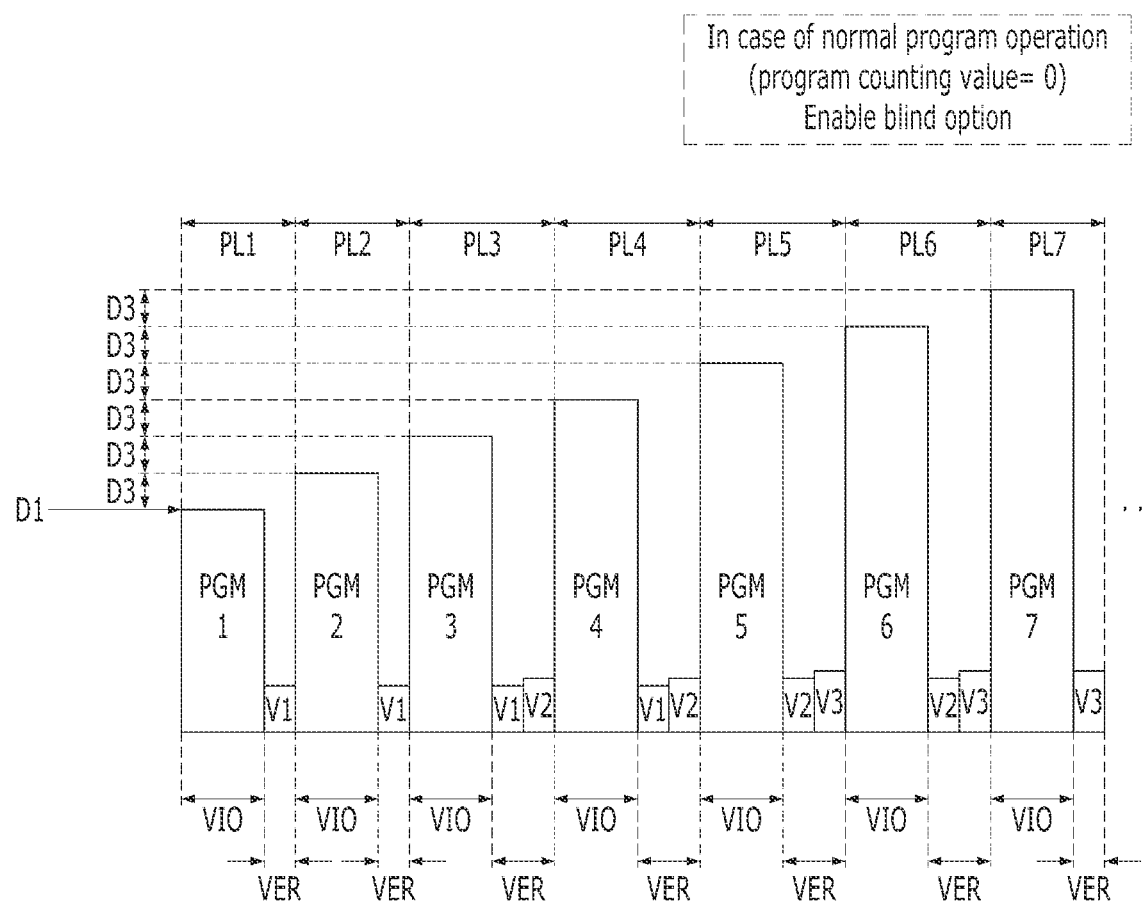
FIG. 2 illustrates a normal program operation performed according to the Incremental Step Pulse Program (ISPP) method in the memory device shown in FIG. 1 in accordance with an embodiment of the present invention.

FIG. 2 illustrates a normal program operation performed according to the Incremental Step Pulse Program (ISPP) method in the memory device shown in FIG. 1 in accordance with an embodiment of the present invention.

Referring to FIG. 1, a memory device 150 according to an embodiment of the present disclosure may include a memory cell array 201 and a controller 202.

The memory cell array 201 may include a plurality of memory blocks (not illustrated). Each memory block may include a plurality of memory cells (not illustrated). One memory block may include a plurality of pages.

The memory blocks may be understood as a group of non-volatile memory cells from which data are removed together through the erase operation. Each of the memory blocks may include a page (not illustrated) in which the non-volatile memory cells are grouped, from a logical point of view, such as storing data together during the program operation or outputting data together during the read operation. For example, one memory block may include a plurality of pages. One page may include a plurality of non-volatile memory cells.

From a physical point of view different from the logical point of view such as the program operation or the read operation, one memory block may include a plurality of word lines (WL<1:n>). One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one data bit, one word line may correspond to one page. When one non-volatile memory cell is a double level cell (DLC) storing two data bits, one word line may correspond to two pages. When one non-volatile memory cell is a triple level cell (TLC) storing three data bits, one word line may correspond to three pages. When one non-volatile memory cell is a quadruple level cell (QLC) storing four data bits, one word line may correspond to four pages. In this way, when one non-volatile memory cell is a multiple level cell storing five or more data bits, one word line may correspond to five or more pages.

The controller 202 may perform a program operation on a selected region of the memory cell array 201. The control unit 202 may perform a program operation on a word line which is selected as a program target among a plurality of word lines (which is hereinafter referred to as a 'program word line') and selected memory cells (which are hereinafter referred to as 'program cells') that are coupled between a plurality of bit lines. That is, the controller 202 may program a memory cell that has been selected as a program target so that the memory cell has one of multiple program states.

In an embodiment, the program state of a single level cell (SLC) in which one data bit is stored may be divided into two program states on the basis of one threshold voltage level. The program state of a multi-level cell (MLC) in which two data bits are stored may be divided into four program states on the basis of three threshold voltage levels. The program state of a triple level cell (TLC) in which three data bits are stored may be divided into eight program states on the basis of seven threshold voltage levels. The program state of a quad level cell (QLC) in which four data bits are stored may be divided into sixteen program states on the basis of fifteen threshold voltage levels.

Referring to FIG. 1 together with FIG. 2, The program operation may include multiple program loops PL1 to PL7. That is, the controller 202 may program a memory cell that has been selected as a program target so that the memory cell has one of multiple program states by repeatedly performing the multiple program loops PL1 to PL7 one by one in a set order until the program operation is completed (see 10 in FIG. 1). Furthermore, the controller 202 may determine the program operation to be a fail if the program operation is not successful within the preset number of program loops.

Herein, each of the program loops PL1 to PL7 may include a voltage application operation VIO of applying a program pulse PGM<1:7> a program word line to change the threshold voltage level of program cells; and a verification operation VER of verifying what program state the program cells are in by applying a verification voltage V<1:3> corresponding to a target level to the program word line.

The potential level of the program voltage may be increased whenever each of the multiple program loops PL1 to PL7 is performed. That is, in the program operation, the level of the program voltage may be increased according to an Incremental Step pulse program (ISPP) method as each of the multiple program loops PL1 to PL7 is repeatedly performed. The number of program voltages applied, a voltage level, and a voltage application time, which are used in each of the multiple program loops PL1 to PL7, may be determined in various forms.

According to an embodiment of the present invention, it may be seen from FIG. 2 that the voltage level of a program pulse PGM1 may be set to a first level D1 in an initial program loop PL1 among the program loops PL1 to PL7, and as each of the program loops PL1 to PL7 is repeated, the voltage level of the program pulse is increased by a third level D3.

Additionally, the memory device 150 according to an embodiment of the present invention may perform an overwrite operation. The program operation in the memory device 150 according to an embodiment of the present invention may be divided into a normal program operation and an overwrite operation.

Herein, the normal program operation may refer to an operation of storing data into program memory cells in which data are not stored. It may refer to an operation of moving the voltage level of program memory cells having a threshold voltage level of an erase state to one threshold voltage level among a plurality of threshold voltage levels.

Figure 7:
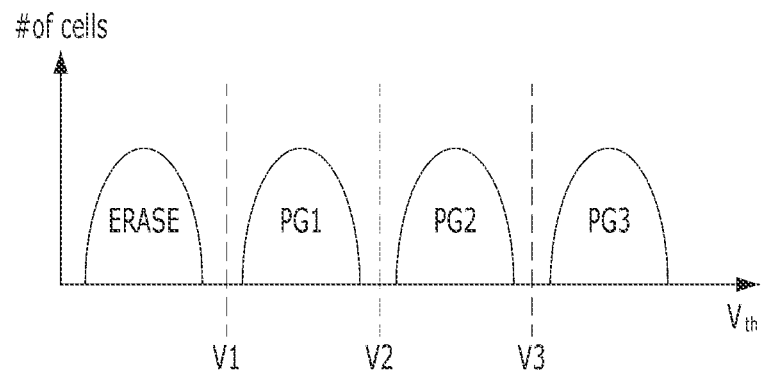
FIG. 7 is a graph illustrating distribution of memory cells according to a program operation.

Referring to FIG. 7, according to an embodiment of the present invention, the program cells in an erase state ERASE in which data are not stored may be in a state having a lower threshold voltage than a first verification voltage V1. In this state, when a normal program operation NORMAL PRORAM for storing 2-bit data in program cells is performed, the threshold voltage levels of the program cells may be one threshold voltage level among four threshold voltage levels that are differentiated according to first to third verification voltages V<1:3>. Namely, through a normal program operation NORMAL PRORAM, the program cells may have a state ERASE, PG1, PG2 and PG3 having one threshold voltage level among a threshold voltage level which is lower than the first verification voltage V1, a threshold voltage level which is equal to or greater than the first verification voltage V1 and lower than the second verification voltage V2, a threshold voltage level which is equal to or greater than the second verification voltage V2 and lower than the third verification voltage V3, and a threshold voltage level which is equal to or greater than the third verification voltage V3.

The overwrite operation may refer to an operation of performing a program operation once again on the program cells in which data are already stored. The retention characteristics of the program cells may be improved by performing an overwrite operation on the program cells having one threshold voltage level among the threshold voltage levels.

To be specific, the control unit 202 according to an embodiment of the present invention may set the voltage level of the initial program pulse PGM1 applied to the program word line to one level from among the first level D1 and the second level D2 in the voltage application operation VIO included in the initial program loop PL1 among the program loops PL1 to PL7 repeated according to the ISPP method for the program cells according to whether the program operation for the program cells is an overwrite operation or not. In this case, the second level D2 may be a level which is lower than the first level D1 by a first set level Va.

Also, the control unit 202 may set, to one of the third and fourth levels D3 and D4, the increment from the voltage level of the initial program pulse to the voltage level of the second program pulse according to whether the program operation for the program cells is an overwrite operation or not. The initial and second program pulses may be applied to the program word line in the voltage application operation VIO respectively included in the initial and second program loops among the program loops PL1 to PL7 repeated according to the ISPP method for the program cells. In this case, the fourth level D4 may be lower than the third level D3 by a second set level Vb. Also, the second program loop may be a program loop that is repeated subsequent to the initial program loop. For example, when the initial program loop is the program loop PL1 that is run first, the second program loop may be the program loop PL2 that is run secondly. For another example, when the initial program loop is the program loop PL2 that is run secondly, the second program loop may be the program loop PL3 that is run thirdly.

To be more specific, the control unit 202 may check whether the program operation for the program cells is an overwrite operation or not (see 20 in FIG. 1). The control unit 202 may check whether the program operation for the program cells is an overwrite operation or not based on a program counting value (not shown) corresponding to a program address (not shown) that is input from the outside to control the program operation for the program cells.

Herein, the control unit 202 may manage the program counting value for each of a plurality of pages included in a memory cell array 201. Also, the control unit 202 may increase the program counting value whenever a program operation for the program cells is performed successfully. The control unit 202 may increase the program counting value for the program cells in response to a successful program operation regardless of whether the program operation for the program cells is a normal program operation or an overwrite operation. Also, in the case of a page selected as an erase operation target, the control unit 202 may initialize the program counting value corresponding to the erase page in response to a successful erase operation.

According to an embodiment, in the case of program cells in which data are not stored, the program counting value may be '0'. Since the program counting value is '0', the control unit 202 may perform a normal program operation as a program operation for the program cells. The control unit 202 may increase the program counting value to '1' when the normal program operation for the program cells is performed successfully.

According to another embodiment, in the case of program cells in which data are stored, the program counting value may be '1' or more. Since the program counting value is equal to or greater than '1', the control unit 202 may perform an overwrite operation as a program operation for the program cells. The control unit 202 may increase the program counting value to '2' or more when the overwrite operation on the program cells is performed successfully.

Also, when the program operation for the program cells is not an overwrite operation, the control unit 202 may set the voltage level of the initial program pulse PGM1 applied to the program word line to the first level D1 in the voltage application operation VIO included in the initial program loop PL1 among the program loops PL1 to PL7 repeated according to the ISPP method for the program cells (see 30 in FIG. 1).

Also, when the program operation for the program cells is an overwrite operation, the control unit 202 may set the voltage level of the initial program pulse PGM1 applied to the program word line to the second level D2 in the voltage application operation VIO included in the initial program loop PL1 among the program loops PL1 to PL7 repeated according to the ISPP method for the program cells (see 40 in FIG. 1). In this case, the second level D2 may be a lower level than the first level D1 by the first set level Va.

Also, when the program operation for the program cells is an overwrite operation, the control unit 202 may adjust the first set level Va according to the program counting value corresponding to the program cells. The control unit 202 may increase the first set level Va in proportion to the program counting value corresponding to the program cells. For example, the first set level Va corresponding to a case where the program counting value corresponding to the program cells is '2' may be greater than the first set level Va corresponding to a case where the program counting value corresponding to the program cells is '1'.

When the program operation for the program cells is not an overwrite operation, the control unit 202 may set, to the third level D3, the increment from the voltage level of the initial program pulse to the voltage level of the second program pulse (see 50 in FIG. 1). The initial and second program pulses may be applied to the program word line in the voltage application operation VIO respectively included in the initial and second program loops among the program loops PL1 to PL7 repeated according to the ISPP method for the program cells.

When the program operation for the program cells is an overwrite operation, the control unit 202 may set, to the fourth level D4, the increment from the voltage level of the initial program pulse to the voltage level of the second program pulse (see 60 in FIG. 1). In this case, the fourth level D4 may be lower than the third level D3 by the second set level Vb.

When the program operation for the program cells is an overwrite operation, the control unit 202 may adjust the second set level Vb according to the program counting value corresponding to the program cells. The control unit 202 may increase the second set level Vb in proportion to the program counting value corresponding to the program cells. For example, the second set level Vb corresponding to the case where the program counting value corresponding to the program cells is '2' may be greater than the second set level Vb corresponding to the case where the program counting value corresponding to the program cells is '1'.

Also, when the program operation for the program cells is an overwrite operation, the control unit 202 may switch a blind option to a disabled state (see 70 in FIG. 1).

Then, when the program operation for the program cells is performed successfully, the control unit 202 may switch the blind option to an enabled state (see 80 in FIG. 1). Regardless of whether the program operation for the program cells is a normal program operation or an overwrite operation, the control unit 202 may switch the blind option to an enabled state in response to a successful program operation.

Herein, the blind option may mean an option for minimizing the number of verification voltages used in the verification operation VER of each of the program loops PL1 to PL7. Since it is difficult to rapidly increase the threshold voltage of the program cells in the initial program loop among the program loops PL1 to PL7, it may mean an option that does not use a high-level verification voltage in the verification operation VER. When the blind option is enabled, the time required for the verification operation VER in each of the program loops PL1 to PL7 may be minimized, and thus the time required for a program operation may be reduced.

The default state of the blind option may be an enabled state. The default state may be a state that a normal program operation is performed while the blind option is enabled. Therefore, since the blind option is already enabled at a moment when a normal program operation starts, the operation (see 80 in FIG. 1) of enabling the blind option in response to the successful program operation in the control unit 202 may be an operation of maintaining the blind option in the enabled state.

On the other hand, in the case of an overwrite operation, since it is an operation of performing a program operation once again on the program cells having one threshold voltage level among the threshold voltage levels, the blind option may be required to be switched to a disabled state. Also, since the blind option is switched to the disabled state for an overwrite operation, when the overwrite operation is performed successfully, it is required to switch the blind option back to the enabled state. Therefore, the control unit 202 may switch the blind option to the enabled state in response to the successful overwrite operation through the operation (see 80 in FIG. 1) of enabling the blind option in response to the successful program operation.

According to an embodiment, in FIG. 2 described above, it may be seen that the blind option is in an enabled state. In the first and second program loops PL1 to PL2, a verification operation VER may be performed using only the first verification voltage V1 having the lowest level. Also, in the third and fourth program loops PL3 to PL4, a verification operation VER may be performed using only the first and second verification voltages V<1:2>. Also, in the fifth and sixth program loops PL5 to PL6, a verification operation VER may be performed using only the second and third verification voltages V<2:3>. Also, in the seventh program loop PL7, a verification operation VER may be performed using only the third verification voltage V3. In this way, in a state that the blind option is enabled, a verification operation VER may be performed using only the minimum number of set verification voltages for each program loop.

According to an embodiment, it may be seen that the blind option is disabled in FIGS. 3A and 3B and FIGS. 4A to 4C, which will be described below. Comparing this with the state that the blind option described in FIG. 2 is enabled, it may be seen that the number of verification voltages used in the verification operation VER included in each of the program loops PL1 to PL7 is increased. In FIGS. 3A and 3B and FIGS. 4A to 4C where the blind option is disabled, the verification operation VER may be performed using the first and second verification voltages V<1:2> in the first to fourth program loops PL1 to PL4. Also, a verification operation VER may be performed using the second and third verification voltages V<2:3> in the fifth to seventh program loops PL5 to PL7. In this way, in the state that the blind option is disabled, a verification operation VER may be performed using at least the minimum number of set verification voltages for each program loop.

As described above, the number of the verification voltages used in each program loop when the blind option is disabled may be set to be greater than the number of the verification voltages used in each program loop when the blind option is enabled. Herein, which verification voltage is used in each program loop when the blind option is enabled and which verification voltage is used in each program loop when the blind option is disabled may be decided and adjusted by the designer.

Figure 3A:
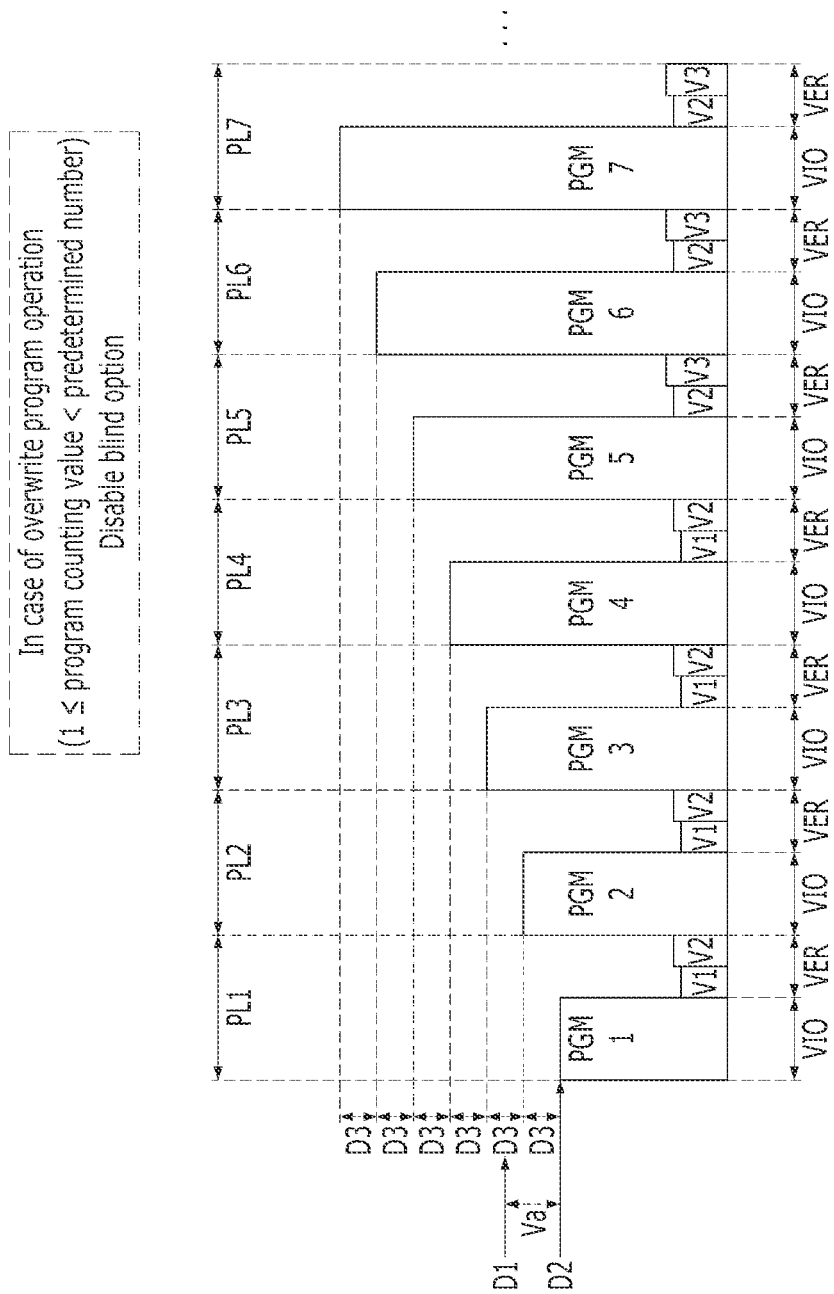
FIGS. 3A and 3B illustrate an overwrite operation performed in the memory device shown in FIG. 1 in accordance with an embodiment of the present invention.
Figure 3B:
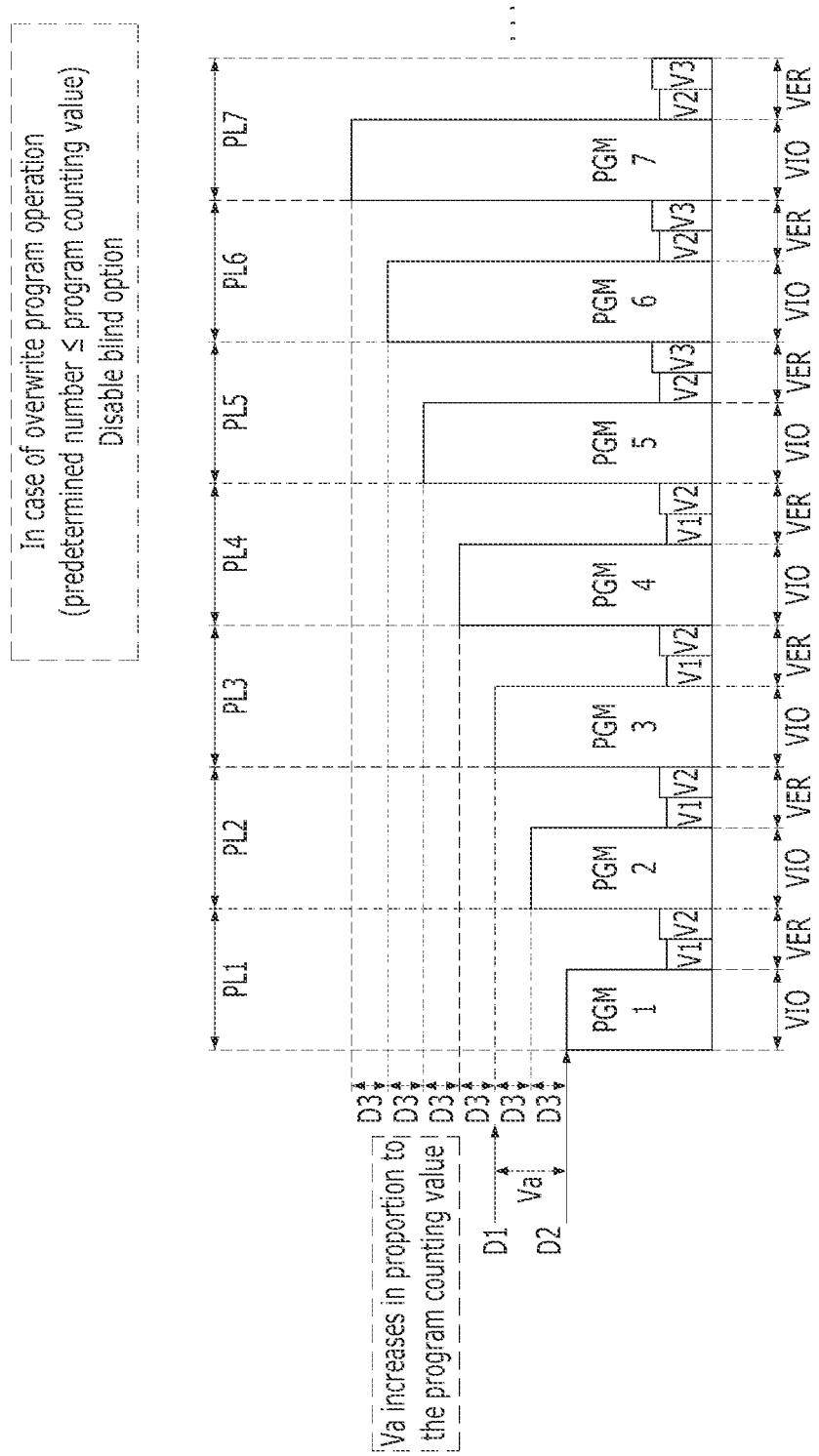

FIGS. 3A and 3B illustrate an overwrite operation performed in the memory device shown in FIG. 1 in accordance with the embodiment of the present invention.

Referring to FIG. 3A together with FIG. 2, it may be seen that the control unit 202 may set the level of the program pulse PGM1 included in the initial program loop PL1 among the program loops PL1 to PL7 to one level among the first level D1 and the second level D2 according to whether the program operation for the program cells is an overwrite operation or not.

To be specific, in FIG. 2, the control unit 202 may perform a normal program operation in response to the program counting value of '0'. Therefore, the control unit 202 may set the voltage level of the program pulse PGM1 applied to the program word line in the initial program loop PL1 among the program loops PL1 to PL7 to the first level D1 in response to the normal program operation, and as each of the program loops PL1 to PL7 is repeated, the voltage level of the program pulse may be increased by the third level D3.

In FIG. 3A, the control unit 202 may perform an overwrite operation in response to the program counting value being equal to or greater than '1' and less than a predetermined number. Therefore, it may be seen that the control unit 202 may set the voltage level of the program pulse PGM1 applied to the program word line in the initial program loop PL1 among the program loops PL1 to PL7 to the second level D2 which is lower than the first level D1 by the first set level Va in response to the overwrite operation, and as each of the program loops PL1 to PL7 is repeated, the voltage level of the program pulse is increased by the third level D3.

Referring to FIG. 3B together with FIG. 3A, it may be seen that even in a state that the program operation for the program cells is an overwrite operation, the first set level Va that represents how low the second level D2 is set compared to the first level D1 is adjusted in proportion to the program counting value.

To be specific, it may be seen that the control unit 202 performs an overwrite operation in response to the program counting value being equal to or greater than '1' and less than the predetermined number in FIG. 3A and performs an overwrite operation in response to the program counting value being equal to or greater than the predetermined number in FIG. 3B. Therefore, the control unit 202 may further increase the first set level Va that is determined in FIG. 3B compared to the first set level Va that is determined in FIG. 3A.

Accordingly, the control unit 202 may set the voltage level of the program pulse PGM1 applied to the program word line in the initial program loop PL1 among the program loops PL1 to PL7 in response to the overwrite operation of FIG. 3A to be relatively higher than the voltage level of the program pulse PGM1 applied to the program word line in the initial program loop PL1 among the program loops PL1 to PL7 in response to the overwrite operation of FIG. 3B.

As described above, it may be seen that even though both FIGS. 3A and 3B correspond to an overwrite operation, the voltage level of the program pulse PGM1 applied to the program word line in the initial program loop PL1 among the program loops PL1 to PL7 may be set differently according to the program counting value.

Also, referring to FIG. 3B just as in FIG. 3A, it may be seen that as each of the program loops PL1 to PL7 is repeated, the voltage level of the program pulse is increased by the third level D3.

Referring to FIGS. 2, 3A, and 3B, it may be seen that the operation of increasing the voltage level of the program pulse by the third level D3 is performed the same as each of the program loops PL1 to PL7 is repeated, while the voltage level of the program pulse PGM1 applied to the program word line in the initial program loop PL1 among the program loops PL1 to PL7 is set differently.

Figure 4A:
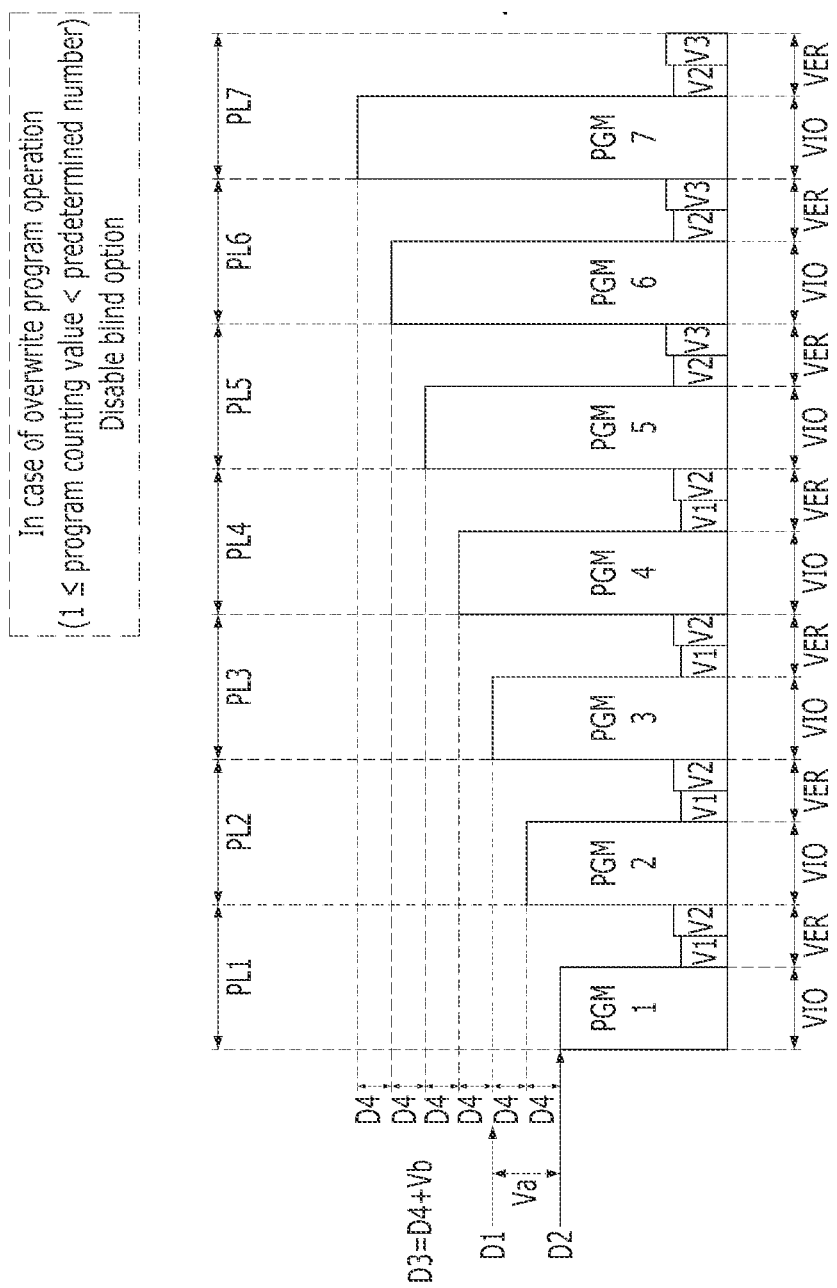
FIGS. 4A to 4C illustrate another overwrite operation performed in the memory device shown in FIG. 1 in accordance with an embodiment of the present invention.
Figure 4B:
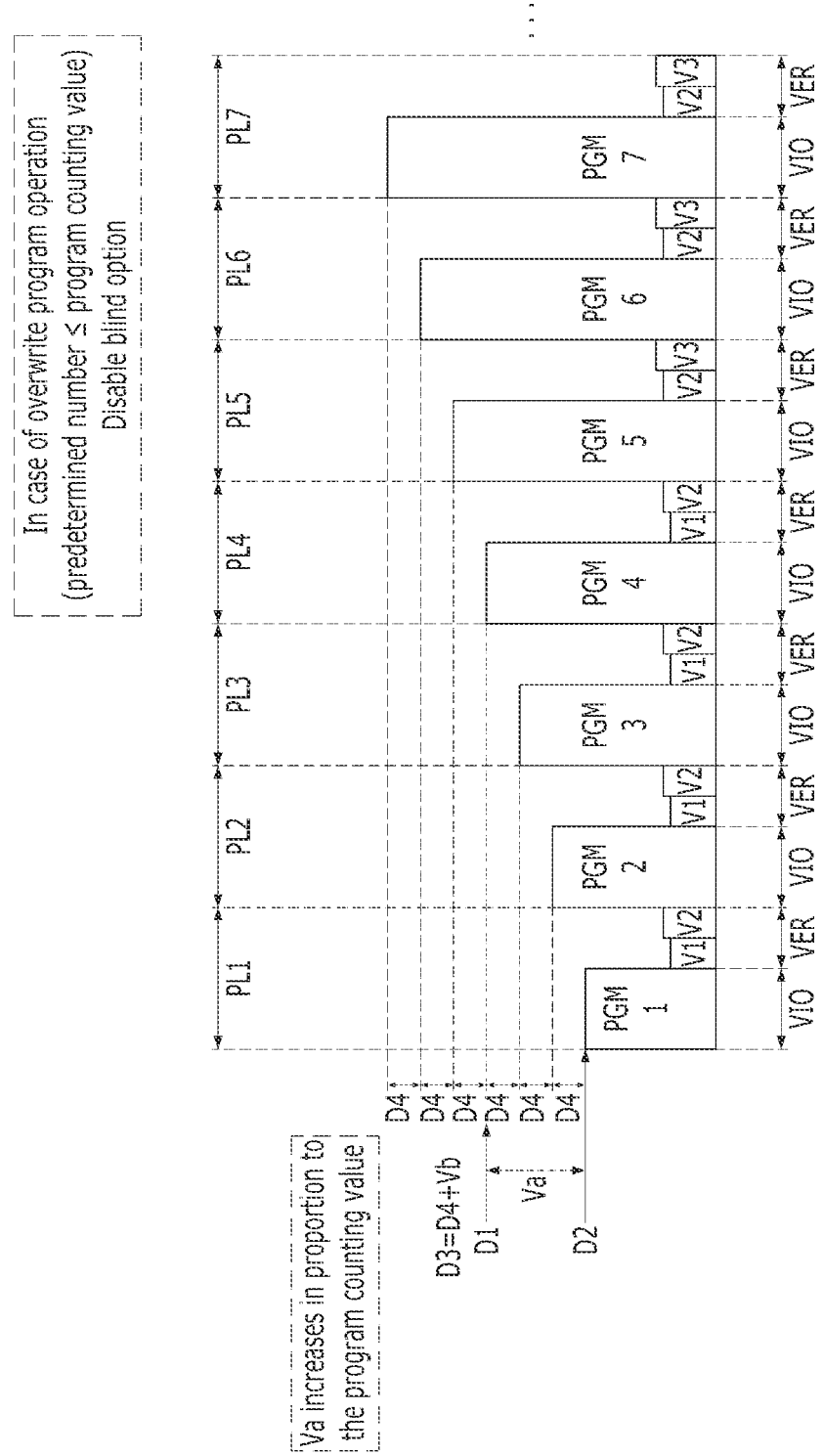
Figure 4C:
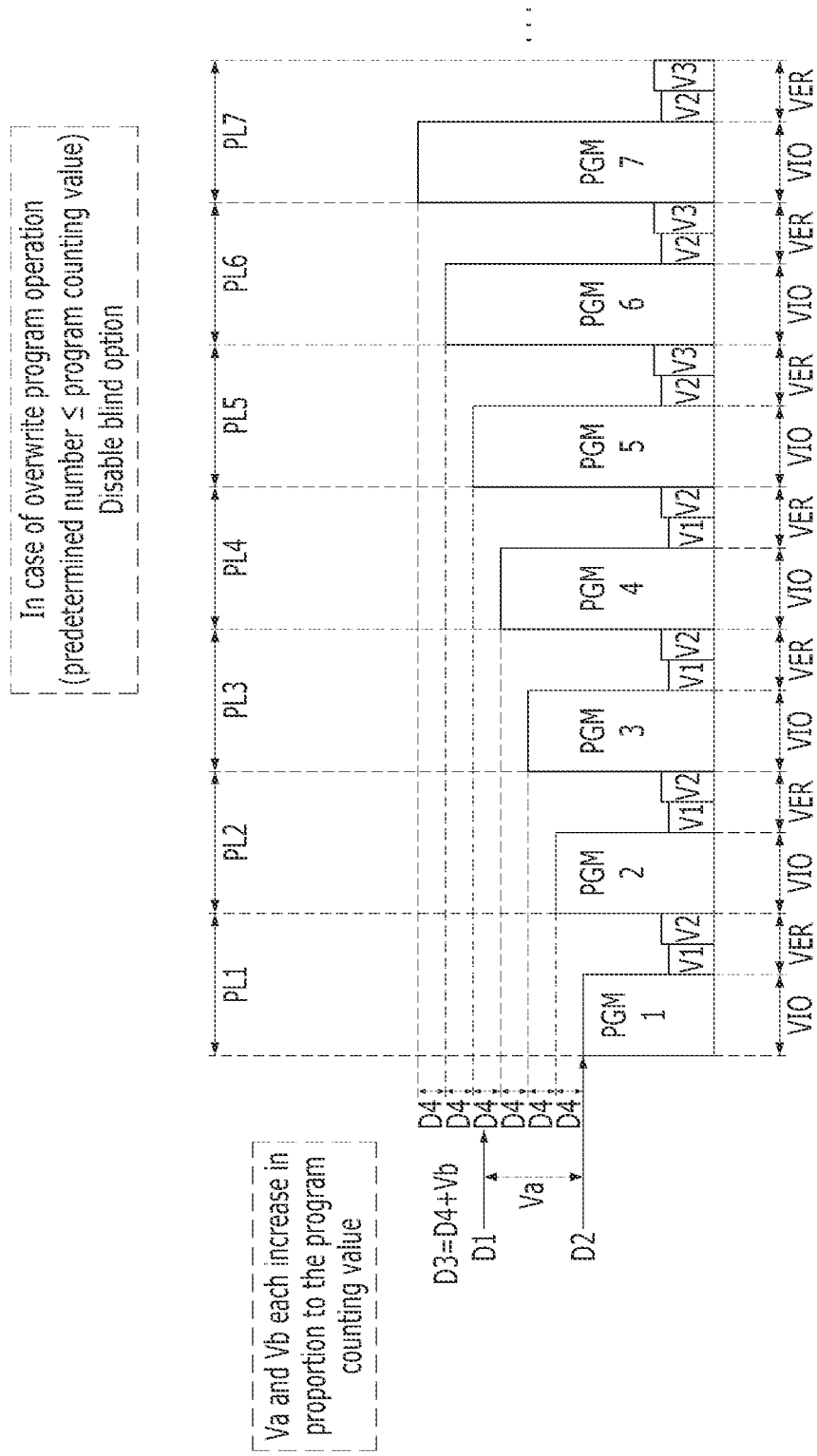

FIGS. 4A to 4C illustrate another example of an overwrite operation performed in the memory device shown in FIG. 1 in accordance with an embodiment of the present invention.

Referring to FIG. 4A together with FIG. 2, it may be seen that the level of the program pulse PGM1 included in the initial program loop PL1 among the program loops PL1 to PL7 is selected as one level from among the first level D1 and the second level D2 according to whether the program operation for the program cells is an overwrite operation or not. Also, it may be seen that the control unit 202 may set, to one of the third and fourth levels D3 and D4, the increment from the voltage level of the initial program pulse to the voltage level of the second program pulse according to whether the program operation for the program cells is an overwrite operation or not. The initial and second program pulses may be applied to the program word line in the voltage application operation VIO respectively included in the initial and second program loops among the program loops PL1 to PL7 repeated according to the ISPP method for the program cells.

To be specific, in FIG. 2, the control unit 202 may perform a normal program operation in response to a program counting value of '0'. Therefore, the control unit 202 may set the voltage level of the program pulse PGM1 applied to the program word line in the initial program loop PL1 among the program loops PL1 to PL7 to the first level D1 in response to the normal program operation, and as each of the program loops PL1 to PL7 is repeated, the voltage level of the program pulse is increased by the third level D3.

In FIG. 4A, the control unit 202 may perform an overwrite operation in response to a program counting value being equal to or greater than '1' and less than the predetermined number. Therefore, it may be seen that the control unit 202 sets the voltage level of the program pulse PGM1 applied to the program word line in the initial program loop PL1 among the program loops PL1 to PL7 to the second level D2 which is lower than the first level D1 by the first set level Va in response to the overwrite operation, and as each of the program loops PL1 to PL7 is repeated, the voltage level of the program pulse is increased by the fourth level D4 which is lower than the third level D3 by the second set level Vb.

Referring to FIG. 4B together with FIG. 4A, it may be seen that even in a state that the program operation for the program cells is an overwrite operation, the first set level Va that represents how small the second level D2 is set compared to the first level D1 is adjusted in proportion to the program counting value.

To be specific, it may be seen that the control unit 202 performs an overwrite operation in response to the program counting value being equal to or greater than '1' and less than the predetermined number in FIG. 4A and performs an overwrite operation in response to the program counting value being equal to or greater than the predetermined number in FIG. 4B. Therefore, the control unit 202 may further increase the first set level Va that is determined in FIG. 4B compared to the first set level Va that is determined in FIG. 4A.

Accordingly, the control unit 202 may set the voltage level of the program pulse PGM1 applied to the program word line in the initial program loop PL1 among the program loops PL1 to PL7 in response to the overwrite operation of FIG. 4A to be relatively higher than the voltage level of the program pulse PGM1 applied to the program word line in the initial program loop PL1 among the program loops PL1 to PL7 in response to the overwrite operation of FIG. 4B.

As described above, it may be seen that even though both FIGS. 4A and 4B correspond to an overwrite operation, the voltage level of the program pulse PGM1 applied to the program word line in the initial program loop PL1 among the program loops PL1 to PL7 may be set differently according to the program counting value.

Also, referring to FIG. 4B just as in FIG. 4A, it may be seen that as each of the program loops PL1 to PL7 is repeated, the voltage level of the program pulse is increased by the fourth level D4.

Referring to FIGS. 4A and 4B, it may be seen that the operation of increasing the voltage level of the program pulse by the fourth level D4 is performed the same as each of the program loops PL1 to PL7 is repeated, while the voltage level of the program pulse PGM1 applied to the program word line in the initial program loop PL1 among the program loops PL1 to PL7 is set differently.

Referring to FIG. 4C together with FIG. 4A, it may be seen that even in a state that the program operation for the program cells is an overwrite operation, the first set level Va that represents how low the second level D2 is set compared to the first level D1 and the second set level Vb that represents how low the fourth level D4 is set compared to the third level D3 are adjusted in proportion to the program counting value.

To be specific, it may be seen that the control unit 202 performs an overwrite operation in response to the program counting value being equal to or greater than '1' and less than the predetermined number in FIG. 4A and performs an overwrite operation in response to the program counting value being equal to or greater than the predetermined number in FIG. 4C. Therefore, the control unit 202 may further increase the first set level Va that is determined in FIG. 4C compared to the first set level Va that is determined in FIG. 4A. Also, the control unit 202 may further increase the second set level Vb that is determined in FIG. 4C compared to the second set level Vb that is determined in FIG. 4A. Herein, the extent that the first set level Va increases may not be related to the extent that the second set level Vb increases. The first set level Va and the second set level Vb may increase independently only in proportion to the program counting value without any limitation between them.

Accordingly, the control unit 202 may set the voltage level of the program pulse PGM1 applied to the program word line in the initial program loop PL1 among the program loops PL1 to PL7 in response to the overwrite operation of FIG. 4A to be relatively higher than the voltage level of the program pulse PGM1 applied to the program word line in the initial program loop PL1 among the program loops PL1 to PL7 in response to the overwrite operation of FIG. 4C.

Also, the control unit 202 may set the fourth level D4 in which the voltage level of the program pulse is increased as each of the program loops PL1 to PL7 is repeated in response to the overwrite operation of FIG. 4A to be relatively higher than the fourth level D4 in which the voltage level of the program pulse is increased as each of the program loops PL1 to PL7 is repeated in response to the overwrite operation of FIG. 4C.

As described above, it may be seen that even though both FIGS. 4A and 4C correspond to an overwrite operation, the voltage level of the program pulse PGM1 applied to the program word line in the initial program loop PL1 among the program loops PL1 to PL7 may be set differently according to the program counting value. Also, it may be seen that even though both FIGS. 4A and 4C correspond to an overwrite operation, the increment of the voltage level of the program pulse may be set differently according to the program counting value as the program loops PL1 to PL7 are performed.

Figure 5:
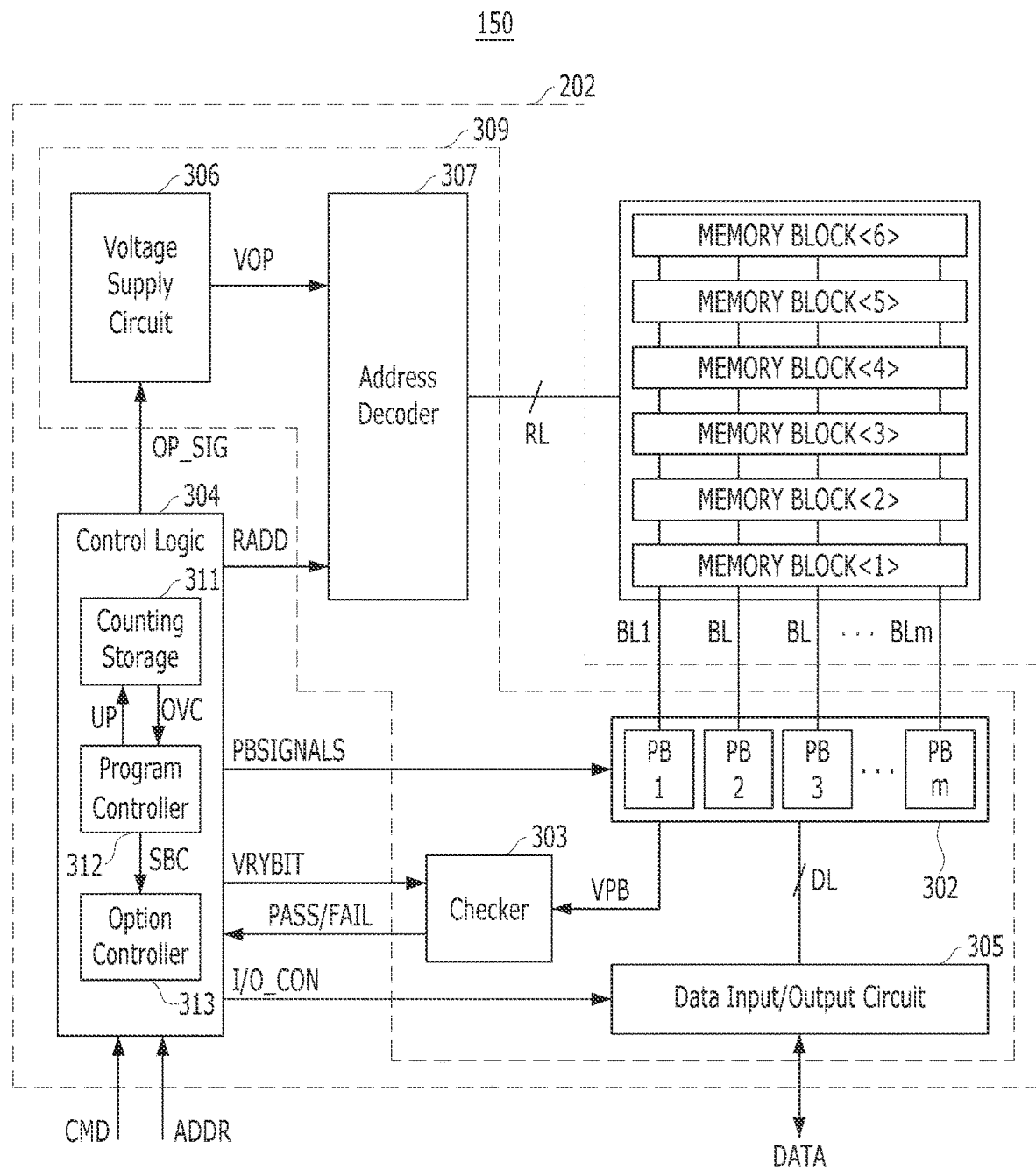
FIG. 5 is a block diagram illustrating a control unit among the constituent elements of the memory device shown in FIG. 1 in accordance with an embodiment of the present invention.

FIG. 5 is a block diagram illustrating a control unit among the constituent elements of the memory device shown in FIG. 1 in accordance with an embodiment of the present invention.

Referring to FIG. 5, the memory device 150 may include a memory cell array 201 and a control unit 202. The control unit 202 may include a control circuit 309 and a control logic 304. The control circuit 309 may include a page buffer 302, a checker 303, a data input/output circuit 305, a voltage supply circuit 306, and an address decoder 307. Also, the control circuit 309 may include a counting storage 311, a program controller 312, and an option controller 313.

The memory cell array 201 may include a plurality of memory blocks MEMORY BLOCK<1:6>. The plurality of memory blocks MEMORY BLOCK<1:6> may be connected to an address decoder 307 through a row line RL. The plurality of memory blocks MEMORY BLOCK<1:6> may be connected to the page buffer unit 302 through bit lines BL1 to BLm. Each of the memory blocks MEMORY BLOCK<1:6> may include a plurality of memory cells.

The row line RL may include at least one source selection line (not illustrated), a plurality of word lines (not illustrated) and at least one drain selection line (not illustrated).

The control circuit unit 309 may be configured to perform a program, read or erase operation on a selected region of the memory cell array 201. The control circuit unit 309 may drive the memory cell array 201. For example, the control circuit unit 309 may apply various operating voltages to the row line RL and the bit lines BL1 to BLm, or discharge the applied voltages. The control circuit 309 may perform a program operation on the program cells in response to the control of the control logic 304. Particularly, the control circuit 309 may perform an overwrite operation as well as a normal program operation on the program cells in response to the control of the control logic 304.

The address decoder 307 among the control circuit unit 309 may be connected to the memory cell array 201 through the row line RL.

The address decoder 307 may be configured to operate in response to the control of the control logic unit 304. The address decoder 307 may receive an address RADD from the control logic unit 304.

The address decoder 307 may be configured to decode a block address of the received address RADD. The address decoder 307 may select at least one memory block from among the memory blocks MEMORY BLOCK<1:6> according to the decoded block address. The address decoder 307 may be configured to decode a row address of the received address RADD. The address decoder 307 may select at least one word line among word lines of the selected memory block according to the decoded row address. The address decoder 307 may apply operating voltages Vop, which are supplied from the voltage supply circuit 306, to the selected word line.

The voltage supply circuit 306 may be included in the control circuit unit 309 may be configured to generate a plurality of operating voltages Vop by using an external power supply voltage. The voltage supply circuit 306 may operate in response to the control of the control logic unit 304.

In an embodiment, the voltage supply circuit 306 may regulate the external power supply voltage and generate an internal power supply voltage.

In an embodiment, the voltage supply circuit 306 may generate the plurality of operating voltages Vop by using the external power supply voltage or the internal power supply voltage.

The voltage supply circuit 306 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic unit 304.

The generated operating voltages Vop may be supplied to the memory cell array 201 by the address decoder 307. For example, the voltage supply circuit 306 may adjust the level and supply time of each of the operation voltages Vop in response to the operation signal OP_SIG.

For example, the voltage supply circuit 306 may generate a program voltage PGM<1:7>, a pass voltage, a verification voltage VRY<1:7>, a read voltage, an erase voltage and the like as an operation voltage VOP and supply the generated operation voltage VOP to the address decoder 307. For example, during a program operation, the voltage supply circuit 306 may generate the program voltage, the pass voltage, and the verification voltage as the operation voltage VOP in response to an operation signal OP_SIG and supply the generated operation voltage VOP to the address decoder 307. In this case, the program voltage may be a voltage supplied to the program word line, and the pass voltage may be a voltage supplied to a word line that is not selected as a program target. The voltage supply circuit 306 may adjust the supply time of each operation voltage VOP according to the operation signal OP_SIG. For example, the voltage supply circuit 306 may adjust the output time of each of the program voltage, the pass voltage, and the verification voltage according to the operation signal OP_SIG and output the voltages according to the adjusted time.

The page buffer unit 302 may include a plurality of page buffers PB1 to PBm. The plurality of page buffers PB1 to PBm may be connected to the memory cell array 201 through the plurality of bit lines BL1 to BLm, respectively. The plurality of page buffers PB1 to PBm may operate in response to the control of the control logic unit 304.

The plurality of page buffers PB1 to PBm may communicate data DATA with the data input/output circuit 157. During the program operation, the plurality of page buffers PB1 to PBm may receive the data to be stored, through the data input/output circuit 157 and a data line DL.

After the start of a program operation, the multiple page buffers PB1 to PBm may store data that is received from the outside through the data input/output circuit 305 and may transmit a program permission voltage or a program inhibition voltage to the bit lines BL1 to BLm in response to the stored data DATA. For example, the program permission voltage may be 0 V, and the program inhibition voltage may be a power supply voltage.

After the start of a read operation, the multiple page buffers PB1 to PBm may sense data DATA based on a voltage or current of the bit lines BL1 to BLm, which is determined based on threshold voltages of the memory cells of a selected page and may transmit the sensed data DATA to the data input/output circuit 305 through the data lines DL.

After the start of an erase operation, the multiple page buffers PB1 to PBm may make the bit lines BL1 to BLm float or may apply a voltage of 0 V to the bit lines BL1 to BLm.

The data input/output circuit 305 may include a plurality of input/output buffers (not illustrated) that receive the data DATA inputted thereto. During the program operation, the data input/output circuit 305 may receive the data DATA to be stored from an external. The data input/output circuit 305 may output the data DATA, which is transmitted from the plurality of page buffers PB1 to PBm included in the page buffer unit 302, to the external during the read operation.

The check unit 303 of the control circuit unit 309 may generate a reference current in response to a verify reference signal VRYBIT that is generated by the control logic unit 304 after the start of a read operation or a verification operation, may compare a sensing voltage VPB that is received from the page buffer group 123 and a reference voltage that is generated from the reference current, and may output a pass signal PASS or a fail signal FAIL to the control logic unit 304. For example, when a level of the sensing voltage VPB is higher than or equal to a level of the reference voltage, the check unit 303 may output the pass signal PASS to the control logic unit 304. When the level of the sensing voltage VPB is lower than the level of the reference voltage, the check unit 303 may output the fail signal FAIL to the control logic unit 304.

The control logic unit 304 may be connected to the address decoder 307, the voltage supply circuit 306, the page buffer unit 302, the data input/output circuit 305, and the check unit 303 that are included in the control circuit unit 309. The control logic unit 304 may be configured to control an overall operation of the memory device 150. The control logic unit 304 may operate in response to a command CMD from an external device.

The control logic unit 304 may control the control circuit unit 309 by generating various signals in response to the command CMD and an address ADDR. For example, the control logic unit 304 may generate an operation signal OPSIG, an address RADD, a read and write control signal PBSIGNALS, and the verify reference signal VRYBIT, in response to the command CMD and the address ADDR. The control logic unit 304 may output the operation signal OPSIG to the voltage supply circuit 306, may output the address RADD to the address decoder 307, may output the read and write control signal PBSIGNALS to the page buffer unit 302, and may output the verify reference signal VRYBIT to the check unit 303. Furthermore, the control logic unit 304 may determine whether a verification operation has passed or failed in response to the pass or fail signal PASS/FAIL that is output by the check unit 303.

To be more specific, the counting storage 311 included in the control logic 304 may store the program counting values of a plurality of pages included in the memory cell array 201. Accordingly, the counting storage 311 may store the program counting values corresponding to the program address indicating the program cells.

The program controller 312 included in the control logic 304 may control the program operations for the program cells.

Also, the program controller 312 may check whether the program operation for the program cells is an overwrite operation or not according to the program counting value OVC corresponding to the program cells stored in the counting storage 311.

Further, the program controller 312 may set the voltage level of the initial program pulse PGM1 applied to the program word line in a voltage application operation VIO included in the initial program loop PL1 among the program loops PL1 to PL7 to one level from among the first level D1 and the second level D2 according to whether the program operation for the program cells is an overwrite operation or not. Herein, the second level D2 may be a level which is lower than the first level D1 by the first set level Va.

Also, the program controller 312 may set, to one of the third and fourth levels D3 and D4, the increment from the voltage level of the initial program pulse to the voltage level of the second program pulse according to whether the program operation for the program cells is an overwrite operation or not. The initial and second program pulses may be applied to the program word line in the voltage application operation VIO respectively included in the initial and second program loops among the program loops PL1 to PL7 repeated according to the ISPP method for the program cells. Herein, the fourth level D4 may be a level which is lower than the third level D3 by the second set level Vb. Also, the second program loop may be a program loop that is repeated subsequent to the initial program loop.

Also, the program controller 312 may increase the program counting value which is stored in the counting storage 311 whenever a program operation on the program cells is performed successfully. The program controller 312 may increase the program counting value for the program cells in response to the successful program operation regardless of whether the program operation for the program cells is a normal program operation or an overwrite operation. Herein, the program controller 312 may generate a signal UP corresponding to the successful program operation on the program cells and transfer it to the counting storage 311. The counting storage 311 may increase the program counting value in response to the output signal UP of the program controller 312.

Also, when the program operation for the program cells is an overwrite operation, the program controller 312 may adjust the first set level Va according to the program counting value corresponding to the program cells. The program controller 312 may increase the first set level Va in proportion to the program counting value corresponding to the program cells.

When the program operation for the program cells is an overwrite operation, the program controller 312 may adjust the second set level Vb according to the program counting value corresponding to the program cells. The program controller 312 may increase the second set level Vb in proportion to the program counting value corresponding to the program cells.

The option controller 313 included in the control unit 202 may control whether to enable the blind option or not in response to an output signal SBC of the program controller 312. The program controller 312 may output the signal SBC having a value for disabling the blind option to the option controller 313 when the program operation for the program cells is an overwrite operation. Also, the program controller 312 may output the signal SBC having a value for enabling the blind option to the option controller 313 in response to the successful program operation on the program cells.

Figure 6:
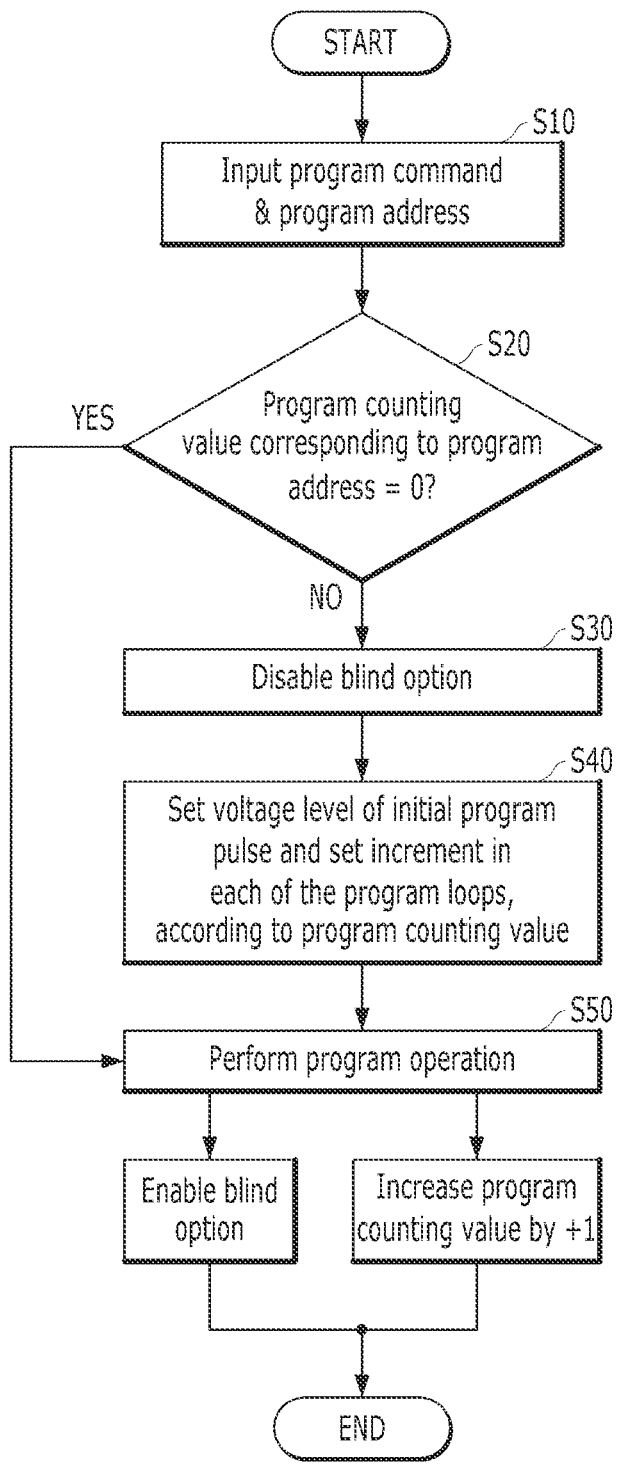
FIG. 6 is a flowchart describing an order of a program operation performed in the memory device shown in FIG. 1 in accordance with an embodiment of the present invention.

FIG. 6 is a flowchart describing an order of a program operation performed in the memory device shown in FIG. 1 in accordance with an embodiment of the present invention.

Referring to FIG. 6, a program command and a program address may be input to the memory device 150 in operation S10.

In operation S20, whether the program counting value corresponding to the program address is '0' or not may be checked.

When the program counting value is '0' in the operation S20 (YES in the operation S20), the program operation for the program cells indicated by the program address may be performed in operation S50. When the program counting value is '0' in the operation S20 (YES in the operation S20), there is no need to perform an overwrite operation, and thus a normal program operation may be performed through the operation S50.

In response to the completion of the normal program operation in the operation S50, the program counting value may be increased by +1 in operation S60. Also, since the blind option has never been disabled prior to performing the normal program operation in the operation S50, the blind option may remain enabled in operation S70.

When the program counting value is not '0' in the operation S20 (NO in the operation S20), it is required to perform an overwrite operation. Thus, the blind option may be disabled in operation S30.

In operation S40 following the operation S30, the voltage level of the initial program pulse PGM1 may be set and the increment of the voltage level may be set in each of the program loops PL1 to PL7, according to the program counting value.

Following the operation S40, an overwrite operation may be performed on the program cells indicated by the program address in the operation S50.

In operation S60, the program counting value corresponding to the program cells may be increased by +1 in response to the completion of the overwrite operation in the operation S50. Also, in operation S70, the blind option may be enabled in response to the completion of the overwrite operation in the operation S50. Since the blind option has been disabled through the operation S30 before the overwrite operation is performed in the operation S50, the blind option may be switched to an enabled state through the operation S70.

According to an embodiment of the present invention, the level of a program pulse applied to a program target word line in the initial program loop may be adjusted according to whether an operation is an overwrite operation or not.

Also, according to an embodiment of the present invention, the amount by which the level of the program pulse applied to the program target word line in the initial program loop may vary according to the number of repetitions of an overwrite operation.

Further, according to an embodiment of the present invention, it is possible to adjust the increment of the voltage level of the program pulse in a repeated program loop according to whether an operation is an overwrite operation or not.

Further yet, according to an embodiment of the present invention, the amount by which the increment of the voltage level of the program pulse is adjusted in a repeated program loop may vary according to the number of repetitions of the overwrite operation.

According to an embodiment of the present invention, it is possible to select whether to disable a blind option or not according to whether an operation is an overwrite operation.

In this way, it is possible to minimize deterioration of the distribution of the memory cells to be programmed in an overwrite operation.

While the present invention has been described with respect to specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory device comprising:
a memory cell array including memory cells coupled between a word line and a plurality of bit lines; and
a control unit suitable for performing a program operation of repeating a program loop including a voltage application operation and a verification operation on the memory cells according to an Incremental Step Pulse Program (ISPP) method until the program operation is performed successfully,
wherein the control unit repeatedly performs the program loop by setting a voltage level of an initial program pulse to one of first and second levels according to whether the program operation is an overwrite operation or not,
wherein the initial program pulse is to be applied to the word line in the voltage application operation included in an initial program loop of the repeated program loops, and
wherein the second level is lower than the first level by a first set level.

2. The memory device of claim 1,
wherein the control unit repeatedly performs the program loop further by setting an increment from the voltage level of the initial program pulse to a voltage level of a second program pulse to one of third and fourth levels according to whether the program operation is the overwrite operation or not,
wherein the second program pulse is to be applied to the word line in the voltage application operation included in a second program loop following the initial program loop among the repeated program loops, and
wherein the fourth level is lower than the third level by a second set level.

3. The memory device of claim 2, wherein the control unit sets, when the program operation is the overwrite operation, the voltage level of the initial program pulse to the second level and the increment to the fourth level.

4. The memory device of claim 2, wherein the control unit is further suitable for:
increasing, in response to a success of the program operation, a program counting value corresponding to a value of a program address indicating the memory cells, and
checking, according to the program counting value, whether the program operation is the overwrite operation or not.

5. The memory device of claim 4, wherein the control unit is further suitable for adjusting, when the program operation is the overwrite operation, the first and second set levels according to the program counting value.

6. The memory device of claim 1, wherein the control unit is further suitable for setting, when the program operation is the overwrite operation, a blind option to a disabled state before the program operation starts and to an enabled state in response to a successful program operation.

7. The memory device of claim 2, wherein the control unit includes:
a counting storage suitable for storing a program counting value corresponding to a value of a program address indicating the memory cells; and
a program controller suitable for:
checking, according to the program counting value, whether the program operation is the overwrite operation or not,
setting the voltage level of the initial program pulse, and
setting the increment.

8. The memory device of claim 7, wherein the program controller is further suitable for increasing the program counting value in response to a successful program operation.

9. The memory device of claim 7, wherein the program controller is further suitable for increasing, when the program operation is the overwrite operation, the first and second set levels in proportion to the program counting value.

10. The memory device of claim 7, wherein the program controller is further suitable for outputting a signal to disable a blind option when the program operation is the overwrite operation and a signal to enable the blind option in response to a successful program operation.

11. The memory device of claim 10, wherein the control unit further includes an option controller suitable for controlling whether to enable the blind option or not in response to the output signal of the program controller.

12. A method for operating a memory device including memory cells coupled between a word line and a plurality of bit lines, the method comprising:
performing a program operation of repeating a program loop including a voltage application operation and a verification operation on the memory cells according to an ISPP (Incremental Step Pulse Program) method until the program operation is performed successfully; and
checking whether the program operation is an overwrite operation or not,
wherein the repeatedly performing includes setting a voltage level of an initial program pulse to one of first and second levels according to whether the program operation is the overwrite operation or not,
wherein the initial program pulse is to be applied to the word line in the voltage application operation included in an initial program loop of the repeated program loops, and
wherein the second level is lower than the first level by a first set level.

13. The method of claim 12, wherein the performing further includes setting an increment from the voltage level of the initial program pulse to a voltage level of a second program pulse to one of third and fourth levels according to whether the program operation is the overwrite operation or not,
wherein the second program pulse is applied to the word line in the voltage application operation included in a second program loop following the initial program loop among the repeated program loops, and
wherein the fourth level is lower than the third level by a second set level.

14. The method of claim 13,
wherein the voltage level of the initial program pulse is set to the second level when the program operation is the overwrite operation, and
wherein the voltage level of the initial program pulse is set to the first level when the program operation is not the overwrite operation.

15. The method of claim 14,
wherein the increment is set to the fourth level when the program operation is the overwrite operation, and
wherein the increment is set to the third level when the program operation is not the overwrite operation.

16. The method of claim 15,
further comprising increasing, in response to a successful program operation, a program counting value corresponding to a value of a program address indicating the memory cells,
wherein whether the program operation is the overwrite operation or not is checked according to the program counting value.

17. The method of claim 16, further comprising increasing the first set level in proportion to the program counting value when the program operation is the overwrite operation.

18. The method of claim 16, further comprising increasing the second set level in proportion to the program counting value when the program operation is the overwrite operation.

19. The method of claim 12, further comprising:
setting, when the program operation is the overwrite operation, a blind option to a disabled state before the program operation starts; and
setting the blind option to an enabled state in response to a successful program operation.

20. An operating method of a memory device, the operating method comprising:
lowering at least one of a voltage level and an increment of a program pulse in proportion to a number of times that a program operation has been successful on a memory cell group according to an Incremental Step Pulse Program (ISPP) scheme; and
performing, based on the lowered voltage level and increment, the program operation according to the ISPP scheme,
wherein the program pulse is provided to the memory cell group at least during each of initial and subsequent program loops within the program operation.

* * * * *